United States Patent
Boselli et al.

(10) Patent No.: US 9,035,352 B2
(45) Date of Patent: May 19, 2015

(54) TWIN-WELL LATERAL SILICON CONTROLLED RECTIFIER

(75) Inventors: Gianluca Boselli, Plano, TX (US); Rajkumar Sankaralingam, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 13/459,504

(22) Filed: Apr. 30, 2012

(65) Prior Publication Data

US 2013/0285114 A1    Oct. 31, 2013

(51) Int. Cl.
- H01L 29/66 (2006.01)
- H01L 29/74 (2006.01)
- H01L 27/02 (2006.01)
- H01L 23/62 (2006.01)

(52) U.S. Cl.
CPC ............ *H01L 29/7436* (2013.01); *H01L 23/62* (2013.01); *H01L 27/0262* (2013.01)

(58) Field of Classification Search
USPC .......................... 257/107, 154, 162, 355–363
See application file for complete search history.

(56) References Cited

U.S. PATENT DOCUMENTS

| | | | | |
|---|---|---|---|---|
| 5,077,591 A | * | 12/1991 | Chen et al. | 257/109 |
| 5,465,189 A | * | 11/1995 | Polgreen et al. | 361/58 |
| 5,572,394 A | * | 11/1996 | Ker et al. | 361/56 |
| 5,614,771 A | * | 3/1997 | Ahmed et al. | 307/113 |
| 6,365,940 B1 | * | 4/2002 | Duvvury et al. | 257/356 |
| 7,728,349 B2 | | 6/2010 | Boselli | |
| 2003/0075726 A1 | | 4/2003 | Ker et al. | |
| 2004/0207017 A1 | * | 10/2004 | Matsumoto et al. | 257/347 |
| 2005/0133869 A1 | * | 6/2005 | Ker et al. | 257/355 |
| 2011/0006342 A1 | * | 1/2011 | Lee et al. | 257/173 |
| 2011/0013326 A1 | * | 1/2011 | Ker et al. | 361/56 |
| 2011/0220975 A1 | * | 9/2011 | Winstead et al. | 257/288 |
| 2012/0008242 A1 | * | 1/2012 | Salcedo | 361/56 |
| 2012/0161216 A1 | * | 6/2012 | Liang et al. | 257/296 |
| 2012/0178228 A1 | * | 7/2012 | Koon et al. | 438/238 |
| 2013/0099280 A1 | * | 4/2013 | Coyne | 257/170 |

* cited by examiner

*Primary Examiner* — Thao X Le
*Assistant Examiner* — Gardner W Swan
(74) *Attorney, Agent, or Firm* — Jacqueline J. Garner; Frank Cimino

(57) ABSTRACT

A LSCR includes a substrate having a semiconductor surface which is p-doped. A first nwell and a second nwell spaced apart from one another are in the semiconductor surface by a lateral spacing distance. A first n+ diffusion region and a first p+ diffusion region are in the first nwell. A second n+ diffusion region is in the second nwell. A second p+ diffusion is between the first nwell and second nwell which provides a contact to the semiconductor surface. Dielectric isolation is between the first n+ diffusion region and first p+ diffusion region, along a periphery between the first nwell and the semiconductor surface, and along a periphery between the second nwell and the semiconductor surface. A resistor provides coupling between the second n+ diffusion region and second p+ diffusion.

14 Claims, 3 Drawing Sheets

TWIN-WELL LATERAL SILICON CONTROLLED RECTIFIER

FIELD

Disclosed embodiments relate to silicon controlled rectifier (SCR) devices.

BACKGROUND

As scaling of devices on metal-oxide-semiconductor (MOS) integrated circuits (ICs) shrinks device dimensions, increased electrostatic discharge (ESD) sensitivity results. It is consequently increasingly important to provide ESD protection circuits to protect the devices and circuits on the IC against ESD-related damage. The ESD robustness of commercial IC products is generally needed to be higher than 2 kV in the Human-Body-Model (HBM) ESD stress. While withstanding ESD overstress, it is desired that on-chip ESD protection circuits also have relatively small dimensional requirements to save semiconductor (e.g., silicon) chip area.

For example, USB 2.0 devices require low total capacitance $C_{TOT\_ESD}$<250 fF with a clamping voltage of the ESD protection of $V_{hold}$>$V_{supply}$ (typically 5V) to minimize interference with normal operations of the device. A small area "footprint" is also desired for on-chip ESD protection circuits. This is typically achieved with Silicon Controlled Rectifiers (SCRs), which, however, feature $V_{hold}$<$V_{supply}$. These conflicting needs must be simultaneously met.

SUMMARY

Disclosed embodiments describe twin-nwell lateral Silicon Controlled Rectifiers (LSCRs) which provide low total capacitance $C_{TOT\_ESD}$<250 fF, with a relatively high holding voltage of $V_{hold}$>5V, and a small footprint. $V_{hold}$ is a tunable parameter that may be set by the design. Disclosed LSCRs can be embodied as on-chip ESD protection circuits, or as stand-alone circuits.

An LSCR in one embodiment comprises a substrate having a semiconductor surface which is p-doped. A first nwell and a second nwell spaced apart from one another are in the semiconductor surface by a lateral spacing distance. A first n+ diffusion region and a first p+ diffusion region are in the first nwell. A second n+ diffusion region is in the second nwell. A second p+ diffusion is between the first nwell and second nwell which provides a contact to the semiconductor surface. Dielectric isolation is between the first n+ diffusion region and first p+ diffusion region, along a periphery between the first nwell and the semiconductor surface, and along a periphery between the second nwell and the semiconductor surface. A resistor provides coupling between the second n+ diffusion region and second p+ diffusion. ICs having disclosed LSCRs thereon are also disclosed.

BRIEF DESCRIPTION OF THE DRAWINGS

Reference will now be made to the accompanying drawings, which are not necessarily drawn to scale, wherein.

DETAILED DESCRIPTION

Figure 1:
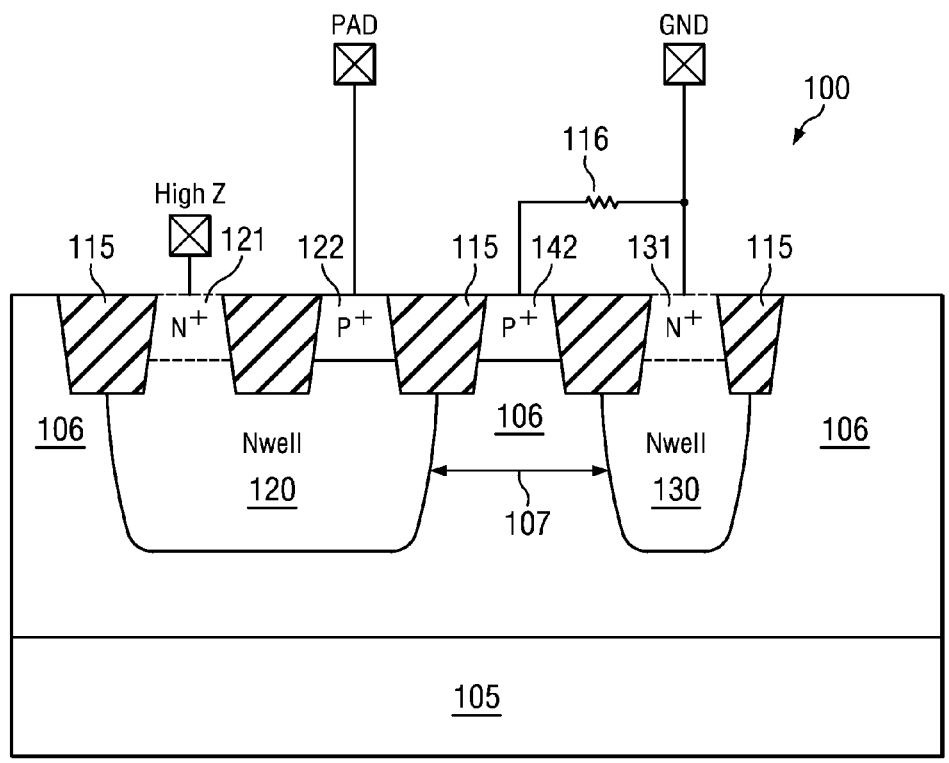
FIG. 1 is a cross sectional depiction of an example LSCR, according to an example embodiment.

Example embodiments are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

FIG. 1 is a cross sectional depiction of an example LSCR 100, according to an example embodiment. Disclosed LSCRs may be embodied as a stand-alone circuit in one embodiment. Alternatively, disclosed LSCRs can be provided on an IC that includes functional circuitry for carrying out a function, such as digital (e.g., logic or processor) application or an analog application, with a disclosed LSCR 100 provided for each pin of the IC needing ESD protection, such as described below relative to FIG. 3. Significantly, the basic masks and processing to fabricate disclosed LSCRs are all generally available in conventional complementary MOS (CMOS) process flows.

LSCR 100 comprises a substrate 105 having a semiconductor surface 106 which is doped p-type, such as a pwell, p-epi, or the surface of a p-substrate, such as a p+ substrate. The substrate 105 can comprise silicon, silicon-germanium, or other substrate that provides a semiconductor surface 106. A first nwell 120 and a second nwell 130 are shown spaced apart from one another in the semiconductor surface 106 by a lateral spacing distance 107. The lateral spacing distance 107 is typically ≥10 μm.

The nwell spacing distance 107 and doping level in semiconductor surface 106 between the nwells 120, 130 can used be used in the design to set the holding voltage after snapback ($V_{hold}$) of LSCR 100. Increasing the nwell spacing distance 107 increases $V_{hold}$. Increasing the doping level in semiconductor surface 106 between the nwells 120, 130 can also raise $V_{hold}$. However, too high a doping level in semiconductor surface 106 can lead to degradation of the ESD performance, as the gain of the lateral NPN bipolar transistor formed by the nwells 120, 130 and the semiconductor surface 106 decreases as the doping level in semiconductor surface 106 increases. A typical doping range for the semiconductor surface 106 is $1\times10^{16}$ to $1\times10^{18}$ acceptor atoms/cm$^3$.

A first n+ diffusion region 121 and a first p+ diffusion region 122 are within the first nwell 120. First p+ diffusion region 122 acts as the trigger node for LSCR 100. A second n+ diffusion region 131 is within the second nwell 130. A second p+ diffusion 142 is between the first nwell 120 and second nwell 130 which provides a topside contact to the semiconductor surface 106. Although not shown, all contacts to the various connections to LSCR 100 may include a silicide layer thereon.

Dielectric isolation 115 is shown between the first n+ diffusion region 121 and first p+ diffusion region 122, along a periphery between the first nwell 120 and the semiconductor surface 106, and along a periphery between the second nwell 130 and the semiconductor surface 106. Dielectric isolation 115 can comprise trench isolation. The trench isolation can comprise shallow trench isolation (STI) which is generally used on CMOS process technology nodes of 250 nanometers and smaller. Analog ICs may utilize LOCOS (local oxidation of silicon) isolation.

A resistor 116 for resistively coupling the second n+ diffusion region 131 to the second p+ diffusion region 142 is also provided. The resistance of resistor 116 is generally from 10 kOhms to 200 kOhms, such as from 20 kOhms to 80 kOhms. Resistor 116 can utilize the parasitic semiconductor surface 106/substrate 105 resistance. The resistor 116 can be designed to set the value of the substrate resistance, Rsub, which allows one to modulate the triggering voltage ($V_{trigg}$) of the LSCR in snapback mode. In another embodiment, resistor 116 comprises a thin film resistor, such as a polysilicon resistor.

Disclosed LSCRs provide low total capacitance, typically <200 pF. The small area typical of LSCRs is one factor in achieving low capacitance. Capacitance is further lowered by reduced junction capacitance resulting from shallow and small area junctions, as well as the respective diffusions having a significant portion of their periphery interfaced with a dielectric surface (e.g., silicon oxide associated with trench isolation).

The pad/node identified as "PAD" in FIG. 1 represents the pad/node to be protected on the IC. A separate LSCR 100 is provided for each pad/node to be protected on the IC (see FIG. 3 described below, for example). The pad/node identified as "GND" is a ground reference node which is also a ground reference on the IC to be protected in application of LSCR 100, that is shown coupled to the semiconductor surface 106/substrate 105 by resistor 116 via the topside contact provided by second p+ diffusion 142. The GND pad/node provides the cathode for LSCR 100. PAD can also act as trigger node if an injector is integrated with LSCR 100 (see FIG. 2 described below). The pad/node identified as "HIGH Z" represents a floating node, a high-impedance (e.g., resistance >100 kOhm to ground), or a capacitor. The HIGH Z pad/node provides the anode for LSCR 100.

The operation of LSCR 100 is generally as follows. Upon an ESD event, induced current injected from "PAD" on an IC turns on the vertical PNP bipolar transistor (first p+ diffusion region 122/first nwell 120/p− semiconductor surface 106) associated with the diode comprising first p+ diffusion region 122/first nwell 120 which biases the lateral NPN bipolar transistor (nwell 120/p− semiconductor surface 106/nwell 130). The positive feedback between the vertical PNP bipolar transistor and lateral NPN bipolar transistor leads to LSCR 100 being triggered on into its latched state. LSCR 100 provides fail safe operation since it has no DC path to a power supply. LSCR 100 is unidirectional, i.e. it provides protection only between "PAD" and "GND". For "GND" to "PAD" protection (in the other direction) a simple, separate diode can be added.

Figure 2:
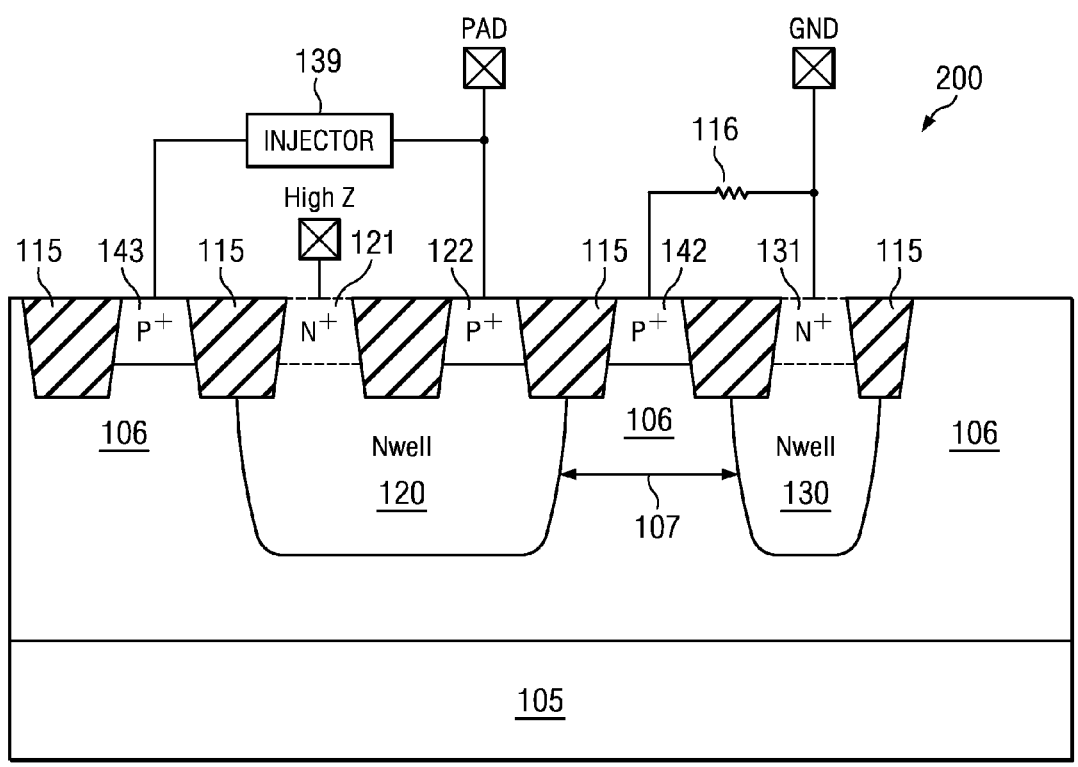
FIG. 2 is a cross sectional depiction of an example LSCR, according to another example embodiment.

FIG. 2 is a cross sectional depiction of an example LSCR 200, according to another example embodiment. LSCR 200 is analogous to LSCR 100 shown in FIG. 1, except it adds a third p+ diffusion 143 to provide another topside contact to the semiconductor surface 106, and adds a connector to couple between the third p+ diffusion 143 and first p+ diffusion region 122 having an "injector" (triggering circuit) 139 along the connector. The injector 139 can be integrated on LSCR 200 and can be driven by external circuitry (e.g., on the IC being protected) to tailor the triggering voltage for LSCR 200.

The injector 139 can be any circuit that injects current into the p− semiconductor surface 106/substrate 105. The purpose of injector 139 is to trigger the LSCR 200 through the injected current rather than the vertical PNP bipolar transistor action (first p+ diffusion region 122/first nwell 120/p− semiconductor surface 106). An advantage of injector 139 is that a lower triggering voltage (a function of the injector construction) can be achieved. An example of injector 139 is an RC triggered nMOS enhancement mode device, whose drain is connected to PAD and whose source is connected to the substrate. When an ESD event occurs, the fast slew-rate of the ESD event makes the RC circuit of the nMOS device pull the gate voltage high, thereby turning-on the nMOS device itself. The resulting MOS current is injected into the substrate, where it is collected by the GND terminal. This will activate the lateral NPN bipolar transistor (nwell 120/p− semiconductor surface 106/nwell 130.

Although not shown, the first n+ diffusion 121 can also be connected to a triggering circuit to tailor triggering voltage. For example, the triggering elements and techniques disclosed in U.S. Pat. No. 7,728,349 to Boselli (the same first named Inventor of this Disclosure) may be used in this alternate embodiment. U.S. Pat. No. 7,728,349 to Boselli is incorporated by reference into this application.

Figure 3:
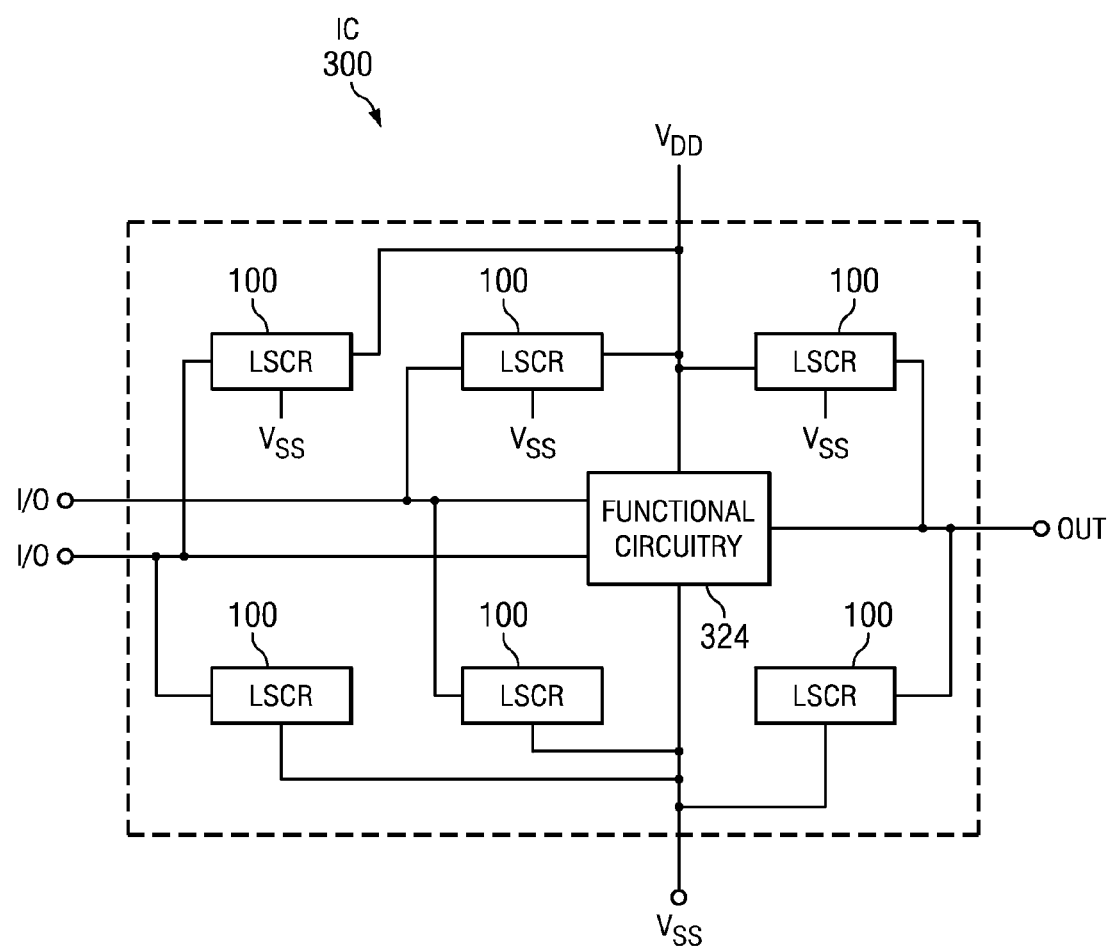
FIG. 3 illustrates a high level depiction of an IC into which disclosed LSCRs may be incorporated to protect one or more terminals of the IC, according to an example embodiment.

FIG. 3 illustrates a high level depiction of a construction of an IC 300 into which disclosed LSCRs may be incorporated to protect one or more terminals of the IC, according to an example embodiment. IC 300 includes functional circuitry 324, which is circuitry that realizes and carries out desired functionality of IC 300, such as that of a digital IC (e.g., digital signal processor) or analog IC (e.g., amplifier or power converter). The capability of functional circuitry provided by IC 300 may vary, for example ranging from a simple device to a complex device. The specific functionality contained within functional circuitry 324 is not of importance to disclosed embodiments.

IC 300 also includes a number of external terminals, by way of which functional circuitry 324 carries out its function. A few of those external terminals are illustrated in FIG. 3. It is to be understood that the number of terminals and their function can also vary widely. In the example of IC 300 shown in FIG. 3, two terminals I/O operate as common input and output terminals, by way of which functional circuitry 324 can receive incoming signals and can generate outputs, as well known in the art. IC 300 is shown in FIG. 3 having a dedicated output terminal OUT. Power supply terminal $V_{DD}$ receives a positive power supply voltage in this example, while ground terminal $V_{SS}$ is provided to receive a reference voltage, such as system ground.

IC 300 includes an instance of a disclosed LSCR 100 connected between $V_{DD}$ and each of the I/Os, OUT, and between $V_{SS}$ and each of the I/Os, OUT. Although not shown, another LSCR 100 may be connected between $V_{DD}$ and $V_{SS}$.

Advantages of disclosed embodiments include LSCRs with high $V_{hold}$ (e.g., >5V) that can be built alongside CMOS circuitry generally without adding any extra mask levels. Disclosed LSCRs also provide tunable $V_{hold}$, such as through changing the lateral spacing distance 107 between the nwells 120 and 130, that is provided without any significant loss of performance. Also, disclosed embodiments provide a low total capacitance solution (generally <200 pF). A significant area saving is provided by disclosed LSCRs as compared to typical snapback-based nMOS solutions as the ESD performance per unit of area is generally 3 to 5 times higher. The area reduction is proportional to the increased performance per unit area. Disclosed LSCRs can be built into any standard dual-diode (DD) ESD cell by modifying to provide disclosed twin nwell construction for seamless integration into DD ESD cells. Moreover, disclosed LSCRs allow fail safe application since there is no DC path to a power supply.

Figure 4A:
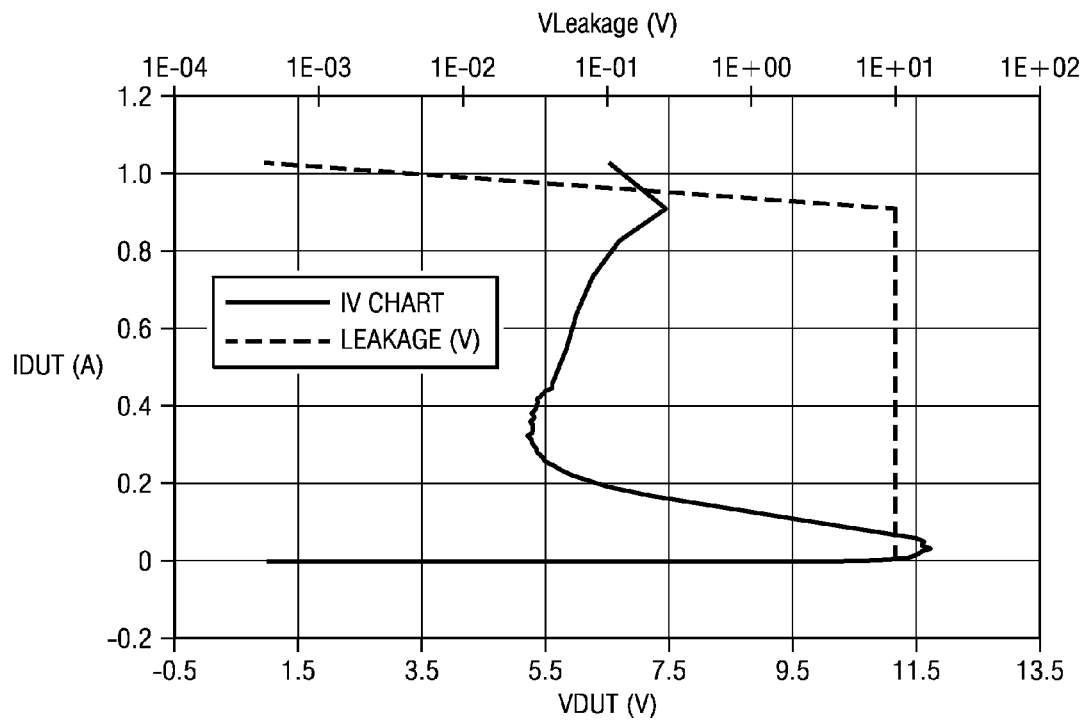
FIGS. 4A and 4B data provide Transmission Line Pulse (TLP) ESD data showing $I_{DUT}$ vs. $V_{DUT}$ for disclosed LSCRs for 10 μm and 15 μm nwell spacing distances, respectively, according to an example embodiment.
Figure 4B:
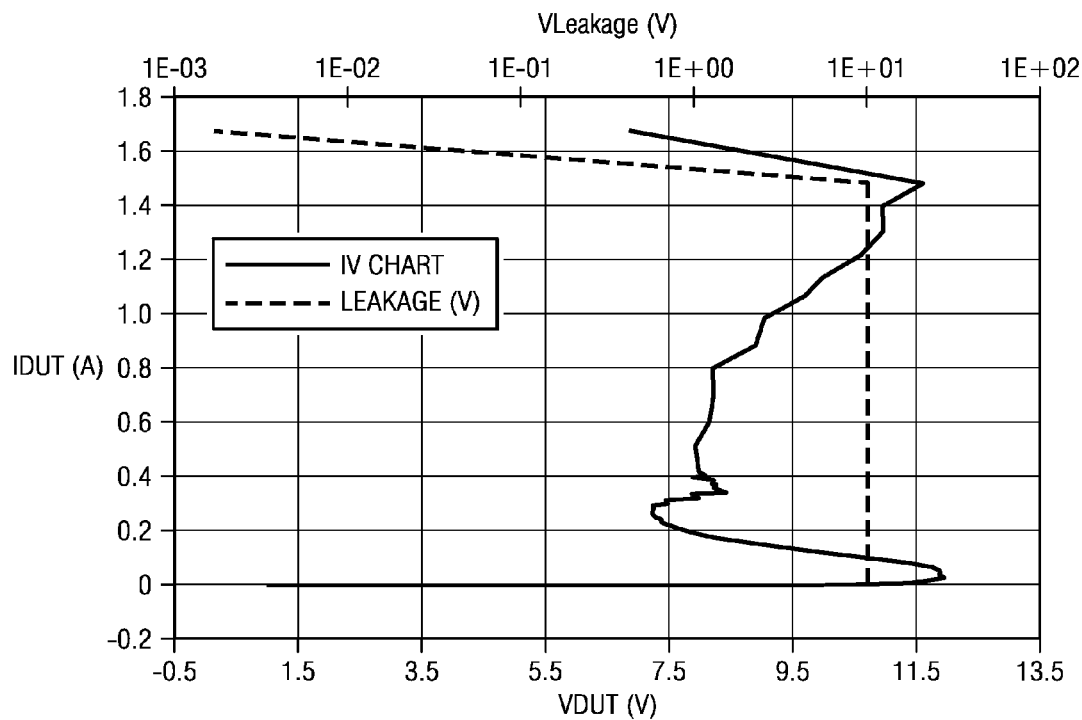

FIGS. 4A and 4B data provide Transmission Line Pulse (TLP) ESD data showing IDUT vs. $V_{DUT}$ for disclosed LSCRs for 10 μm and 15 μm nwell spacing distances, respectively, along with $V_{Leakage}$, according to an example embodiment. FIG. 4A shows a $V_{hold}$ after snapback of about 5.4V, while FIG. 4B shows a $V_{hold}$ after snapback of about 7.4V, demonstrating that $V_{hold}$ may be increased by increasing the nwell spacing distance. $V_{hold}$ can be designed with working voltages in mind to be as small as possible, but larger than working voltage to prevent latch-up and interference with normal operating conditions of the IC being protected.

Disclosed embodiments can be integrated into a variety of assembly flows to form a variety of different semiconductor integrated circuit (IC) devices and related products. The semiconductor die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the semiconductor die can be formed from a variety of processes including bipolar, CMOS, BiCMOS and MEMS.

Those skilled in the art to which this Disclosure relates will appreciate that many other embodiments and variations of embodiments are possible within the scope of the claimed invention, and further additions, deletions, substitutions and modifications may be made to the described embodiments without departing from the scope of this disclosure.

We claim:

1. A lateral silicon controlled rectifier (LSCR), comprising:
   a substrate having a semiconductor surface which is p-doped;
   a first nwell and a second nwell spaced apart from one another in said semiconductor surface by a lateral spacing distance;
   a first n+ diffusion region and a first p+ diffusion region in said first nwell, wherein the first n+ diffusion region is connected directly to a high impedance node and the first p+ diffusion region is connected directly to a pad to be protected;
   a second n+ diffusion region entirely in said second nwell, wherein the second n+ diffusion region is connected directly to a ground reference;
   a second p+ diffusion region between said first nwell and said second nwell providing a contact to said semiconductor surface;
   dielectric isolation between said first n+ diffusion region and said first p+ diffusion region, along a periphery of said first nwell at said semiconductor surface, and along a periphery of said second nwell at said semiconductor surface, and
   a resistor coupling said second n+ diffusion region to said second p+ diffusion region.

2. The LSCR of claim 1, wherein said semiconductor surface comprises a pwell.

3. The LSCR of claim 1, wherein said semiconductor surface comprises a p-type epitaxial layer on said substrate.

4. The LSCR of claim 1, wherein a resistance of said resistor is from 10 kOhms to 200 kOhms.

5. The LSCR of claim 1, wherein said resistor utilizes said semiconductor surface.

6. The LSCR of claim 1, wherein said resistor comprises a polysilicon resistor.

7. The LSCR of claim 1, wherein said lateral spacing distance is at least 10 μm.

8. The LSCR of claim 1, further comprising a third p+ diffusion region in said semiconductor surface outside of said first nwell and said second nwell, and a connector coupling said third p+ diffusion region and said first p+ diffusion region, and an injector along said connector for injecting current into said semiconductor surface.

9. An integrated circuit (IC), comprising:
   a substrate having a semiconductor surface which is p-doped;
   functional circuitry on said semiconductor surface configured to realize and carry out a functionality, having a plurality of terminals including at least a first terminal and a ground terminal;
   a lateral silicon controlled rectifier (LSCR) on said semiconductor surface, comprising:
      a first nwell and a second nwell spaced apart from one another in said semiconductor surface by a lateral spacing distance;
      a first n+ diffusion region and a first p+ diffusion region in said first nwell, wherein the first n+ diffusion region is connected directly to a high impedance node;
      a second n+ diffusion region entirely in said second nwell;
      a second p+ diffusion region between said first nwell and said second nwell providing a contact to said semiconductor surface;
      dielectric isolation between said first n+ diffusion region and said first p+ diffusion region, along a periphery of said first nwell at said semiconductor surface, and along a periphery of said second nwell at said semiconductor surface, and
      a resistor coupling said second n+ diffusion region to said second p+ diffusion region,
   wherein said first terminal is connected directly to said first p+ diffusion region, and wherein said ground terminal is connected directly to said second n+ diffusion region.

10. The IC of claim 9, wherein a resistance of said resistor is from 10 kOhms to 200 kOhms.

11. The IC of claim 9, wherein said resistor utilizes said semiconductor surface.

12. The IC of claim 9, wherein said resistor comprises a polysilicon resistor.

13. The IC of claim 9, wherein said lateral spacing distance is at least 10 μm.

14. The IC of claim 9, further comprising a third p+ diffusion region in said semiconductor surface outside of said first nwell and said second nwell, and a connector coupling said third p+ diffusion region and said first p+ diffusion region, and an injector along said connector for injecting current into said semiconductor surface.

* * * * *